US012562735B2

(12) United States Patent
Tseng et al.

(10) Patent No.: US 12,562,735 B2
(45) Date of Patent: Feb. 24, 2026

(54) OVER DRIVE CIRCUIT AND INPUT/OUTPUT CIRCUIT

(71) Applicant: United Microelectronics Corp., Hsinchu (TW)

(72) Inventors: Wei Hang Tseng, Hsinchu (TW); Ya-Nan Mou, Hsinchu (TW); Tai Chi Kao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 8 days.

(21) Appl. No.: 18/673,265

(22) Filed: May 23, 2024

(65) Prior Publication Data

US 2025/0317142 A1 Oct. 9, 2025

(30) Foreign Application Priority Data

Apr. 8, 2024 (TW) ................................. 113112926

(51) Int. Cl.
*H03K 17/687* (2006.01)
*H03K 17/12* (2006.01)
(52) U.S. Cl.
CPC ....... *H03K 17/6872* (2013.01); *H03K 17/122* (2013.01)

(58) Field of Classification Search
CPC .. H03K 17/6872; H03K 17/102; H03K 17/10; H03K 17/122; H03K 17/12; H03K 17/164; H03K 17/163; H03K 17/161; H03K 17/16; H03K 19/00315; H03K 19/018521; H03K 19/0185; H03K 19/018507; H03K 17/002; H03K 17/007; H03K 17/735; H03K 17/76
See application file for complete search history.

(56) References Cited

U.S. PATENT DOCUMENTS 5,917,758 A * 6/1999 Keeth .................. H03K 17/164
                                              365/189.11
7,196,965 B2 3/2007 Han et al.

* cited by examiner

*Primary Examiner* — Jung Kim
(74) *Attorney, Agent, or Firm* — JCIPRNET

(57) ABSTRACT

An over drive circuit and an input/output circuit are provided. The over drive circuit includes multiple P-type transistors connected to each other in series and a first N-type transistor connected to the P-type transistors in series. One end of the over drive circuit is coupled to a first voltage. Transistors connected in parallel connected to the first N-type transistor in series. Multiple N-type transistors with smaller size than the first N-type transistor are turned on in sequence.

16 Claims, 6 Drawing Sheets

<u>100</u>

OVER DRIVE CIRCUIT AND INPUT/OUTPUT CIRCUIT

CROSS-REFERENCE TO RELATED APPLICATION

This application claims the priority benefit of Taiwan application serial no. 113112926, filed on Apr. 8, 2024. The entirety of the above-mentioned patent application is hereby incorporated by reference herein and made a part of this specification.

BACKGROUND

Technical Field

The disclosure relates to a drive circuit, and in particular to an over drive circuit and an input/output circuit.

Description of Related Art

In existing input/output circuits, if over drive operation is required, that is, a wider input/output range, an over drive circuit needs to be disposed. The current over drive circuit can be implemented by a stacked structure of transistors. As shown in FIG. 1, an over drive circuit 10 has two series-connected PMOS transistors P1 and P2 and two series-connected NMOS transistors N1 and N2 connected to each other in series. A gate of the PMOS transistor P1 and a gate of the NMOS transistor N1 are respectively coupled to the control signal S_1. A source-drain of the PMOS transistor P1 is coupled to a required voltage (an over drive voltage) OVDD. A gate of the PMOS transistor P2 and a gate of the NMOS transistor N2 are coupled to a nominal voltage VDD. Under this architecture, the over drive circuit 10 can output the overvoltage OVDD that is higher than the nominal voltage VDD.

However, under this architecture, the transistor of this stacked circuit structure may bear over stress. Especially when the over drive circuit 10 is operating, a source-drain voltage Vds of the turned-on transistor N1 may be too large. This phenomenon may aggravate the aging effect of the over drive circuit 10, thereby causing damage to the integrity of the output signal of the output end OUT of the over drive circuit 10.

Therefore, a stacked over drive circuit is proposed, which can reduce the aging effect and maintain the integrity of the input signal of the over drive circuit.

SUMMARY

Based on the above description, according to an embodiment of the disclosure, an over drive circuit is provided. The over drive circuit includes: multiple P-type transistors connected to each other in series, where each of the P-type transistors has a control end, a first end, and a second end, and a first end of a first P-type transistor of the P-type transistors is coupled to a first voltage; a first N-type transistor connected to the of P-type transistors, where the first N-type transistors has a control end, a first end, and a second end, a first end of the first N-type transistor is coupled to a second end of a last P-type transistor of the P-type transistors; an output end disposed between the plurality P-type transistors and the first N-type transistor; and a load coupled between the output end and the ground potential; and multiple transistors connected in parallel, and the transistors are N-type transistors. A control end of each of the transistors is respectively coupled to each of multiple corresponding control signals. One of the control signals is further input to a control end of the first P-type transistor of the P-type transistors. The control ends of the P-type transistors other than the first P-type transistor and the first N-type transistor receive a second voltage, where the first voltage is greater than the second voltage.

According to another embodiment of the disclosure, an input/output circuit is provided, which at least includes the aforementioned over drive circuit.

According to an embodiment of the disclosure, in the aforementioned over drive circuit or input/output circuit, a level value of each of the control signals is between the second voltage and the ground potential.

According to an embodiment of the disclosure, in the aforementioned over drive circuit or input/output circuit, there is a delayed time between every two of the control signals. According to an embodiment of the disclosure, in the aforementioned over drive circuit or input/output circuit, the delayed time between every two of the control signals is the same or different.

According to an embodiment of the disclosure, in the aforementioned over drive circuit or input/output circuit, the control signals make the transistors be turned on in sequence.

According to an embodiment of the disclosure, in the aforementioned over drive circuit or input/output circuit, a sum of a channel length of each of the transistors is equal to a channel length of the first N-type transistor. According to an embodiment of the disclosure, in the aforementioned over drive circuit or input/output circuit, the channel length of each of the transistors is the same.

According to an embodiment of the disclosure, in the aforementioned over drive circuit or input/output circuit, the load is a capacitive load. According to an embodiment of the disclosure, in the aforementioned over drive circuit or input/output circuit, the P-type transistors are P metal oxide semiconductor (PMOS) transistors, and the first N-type transistor and the multiple transistors are NMOS transistors.

Based on the aforementioned embodiments of the disclosure, the over drive circuit may reduce the aging effect and maintain the integrity of the input signal of the over drive circuit.

DESCRIPTION OF THE EMBODIMENTS

Figure 2:
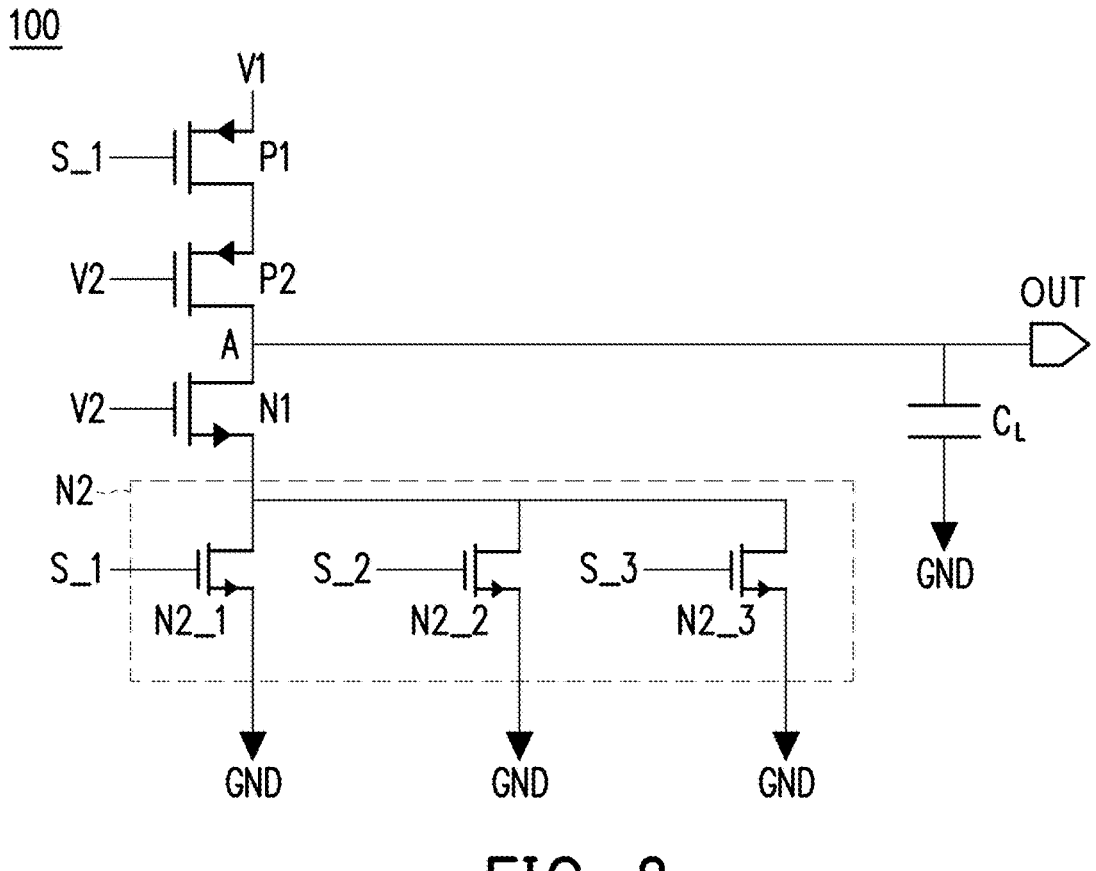
FIG. 2 is a schematic diagram of an over drive circuit according to an embodiment of the disclosure.

FIG. 2 is a schematic diagram of an over drive circuit according to an embodiment of the disclosure. As shown in FIG. 2, an over drive circuit 100 includes: multiple P-type transistors connected in series and multiple N-type transistors connected in series. The P-type transistors connected in series and the N-type transistors connected in series are further connected in series. In this embodiment, the P-type transistors are exemplified by two P-type transistors, namely P-type transistors P1 and P2, and the N-type transistors are also exemplified by two N-type transistors, namely, a first N-type transistor N1 and a second N-type transistor N2. Furthermore, as an example, the number of P-type transistors and the number of N-type transistors may be equal.

In addition, the P-type transistor is, for example, a P metal oxide semiconductor (PMOS) transistor. Without affecting the operation of the over drive circuit of the disclosure, a field-effect transistor (FET) or other P-type doped transistors may also be used. The N-type transistor, for example, is an N metal oxide semiconductor (NMOS) transistor. Without affecting the operation of the over drive circuit of the disclosure, a FET or other N-type doped transistors may also be used. In the following description, the PMOS transistor and the NMOS transistor are used as examples.

In addition, the second N-type transistor N2, that is, a last one of the N-type transistors connected in series is an equivalent transistor. In this embodiment, the second N-type transistor N2 actually comprises multiple transistors N2_1, N2_2, and N2_3 that are smaller in size than the other N-type transistors N1 and N2 and are connected in parallel. Here, three transistors are connected in parallel as an example. In addition, the transistors N2_1, N2_2, and N2_3 are all N-type transistors, such as NMOS transistors. The transistors N2_1, N2_2, N2_3 have the same or different sizes.

As shown in FIG. 2, the P-type transistors P1 and P2 are connected to each other in series. Each P-type transistor has a control end, a first end, and a second end. The aforementioned control end may generally be a gate of the P-type transistor P1 (P2), and the first end and the second end may be a pair of sources/drains of the P-type transistor P1 (P2). In addition, in this circuit, the first voltage V1 is, for example, a fixed value and is a required output voltage; the second voltage V2 is, for example, a fixed value, which is also called a nominal voltage VDD. Generally, the first voltage V1 is greater than the second voltage V2. As an example, the first voltage V1 may be, for example, 3.3V, and the second voltage V2, for example, may be 1.8V.

A first PMOS transistor of multiple PMOS transistors is the PMOS transistor P1 in this embodiment, and a first end of the PMOS transistor P1 is coupled to the first voltage V1. The gate of the PMOS transistor P1 receives a control signal S_1. In addition, a first end of the PMOS transistor P2 is coupled to a second end of the PMOS transistor P1. A last PMOS transistor of the PMOS transistors, as a gate of the PMOS transistor P2 in this embodiment, receives the second voltage V2 as the nominal voltage. A second end of the PMOS transistor P2 is coupled to a node A.

In addition, a first NMOS transistor (i.e., the first N-type transistor) of multiple NMOS transistors, in this embodiment, is the NMOS transistor N1, and a first end of the NMOS transistor N1 is coupled to the node A. Therefore, a string of the PMOS transistor P1 and P2 and a string of the NMOS transistor N1 and N2 are connected in series. A gate of the NMOS transistor N1 receives the second voltage V2 as the nominal voltage. In addition, a last NMOS transistor of the NMOS transistors is a NMOS transistor N2 in this embodiment, a first end of the NMOS transistor N2 is coupled to a second end of the NMOS transistor N1, and the second end of the NMOS transistor N2 is coupled to a ground potential GND.

In addition, the over drive circuit 100 also has an output end OUT disposed between the plurality P-type transistors P1, P2 and the first N-type transistor N1. The node A coupled with the PMOS transistor P2 and the NMOS transistor N2 is used as the output end OUT. A maximum value of an output signal is the first voltage V1. The output signal is a signal to be switched between the first voltage V1 and the ground potential GND. In addition, the over drive circuit 100 also has a load, which is coupled between the output end OUT (or the node A) and the ground potential GND. As an example, the load may be a capacitive load $C_L$.

Here, the NMOS transistor (i.e., the second N-type transistor) N2, represents an equivalent transistor, which actually comprises multiple transistors connected in parallel. In this embodiment, the NMOS transistor N2 is composed of three NMOS transistors N2_1, N2_2, and N2_3 connected in parallel. A first end of each of the NMOS transistor N2_1, N2_2, and N2_3 is coupled together and is equivalent to the first end of the NMOS transistor N2. A second end of each of the NMOS transistor N2_1, N2_2, and N2_3 is coupled together and is equivalent to the second end of the NMOS transistor N2.

In addition, a gate (that is, a control end) of each of the NMOS transistors N2_1, N2_2, and N2_3 is respectively coupled to each of the corresponding control signals S_1, S_2, and S_3. As mentioned above, a first control signal S_1 of the control signals is further input to a control end of the PMOS transistor P1.

In the aforementioned architecture, the NMOS transistor N2_1, N2_2, and N2_3 have channel lengths L1, L2, and L3 respectively, and the equivalent NMOS transistor N2 has an equivalent channel length Leff. According to an embodiment of the disclosure, the equivalent channel length Leff of the NMOS transistor N2 (or the NMOS transistor N1) is equal to a sum of the channel lengths L1, L2, and L3 of the NMOS transistors N2_1, N2_2, and N2_3, that is, Leff=L1+L2+L3. As an example, the channel lengths L1, L2, and L3 of the NMOS transistors N2_1, N2_2, and N2_3 are different. As another example, the channel lengths L1, L2, and L3 of the NMOS transistors N2_1, N2_2, and N2_3 are the same. As another example, when more transistors (such as n) are implemented in parallel, channel lengths L1, L2, . . . , and Ln of the transistors may be partially the same.

Figure 3A:
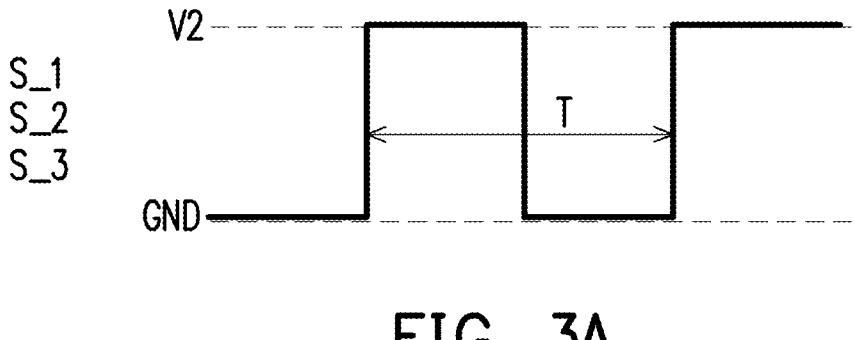
FIG. 3A and FIG. 3B are schematic waveform diagrams of control signals and input and output signals of an over drive circuit according to an embodiment of the disclosure.
Figure 3B:
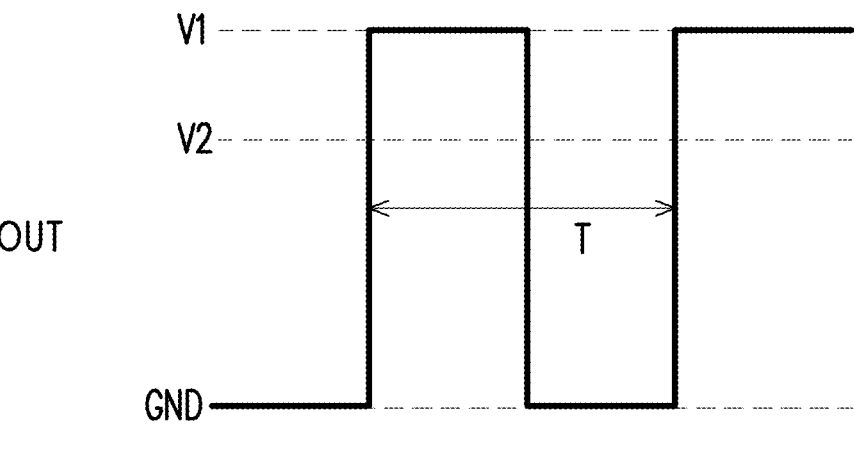

FIG. 3A and FIG. 3B are schematic waveform diagrams of control signals and input and output signals of an over drive circuit according to an embodiment of the disclosure. As shown in FIG. 3A, the control signal S_1 (or S_2 or S_3) may be a cycle waveform with a duty ratio (for example, 50%), and a cycle of the cycle waveform is T. A level of the control signal S_1 (or S_2 or S_3) is between the second voltage V2 (a high level) and the ground potential GND (a low level). In addition, as shown in FIG. 3B, the output signal of the output end may be a cycle waveform with a duty ratio (for example, 50%), and also has a cycle T. A level of the output signal is between the first voltage V1 (a high level) as the required voltage and the ground potential GND (a low level).

Figure 4:
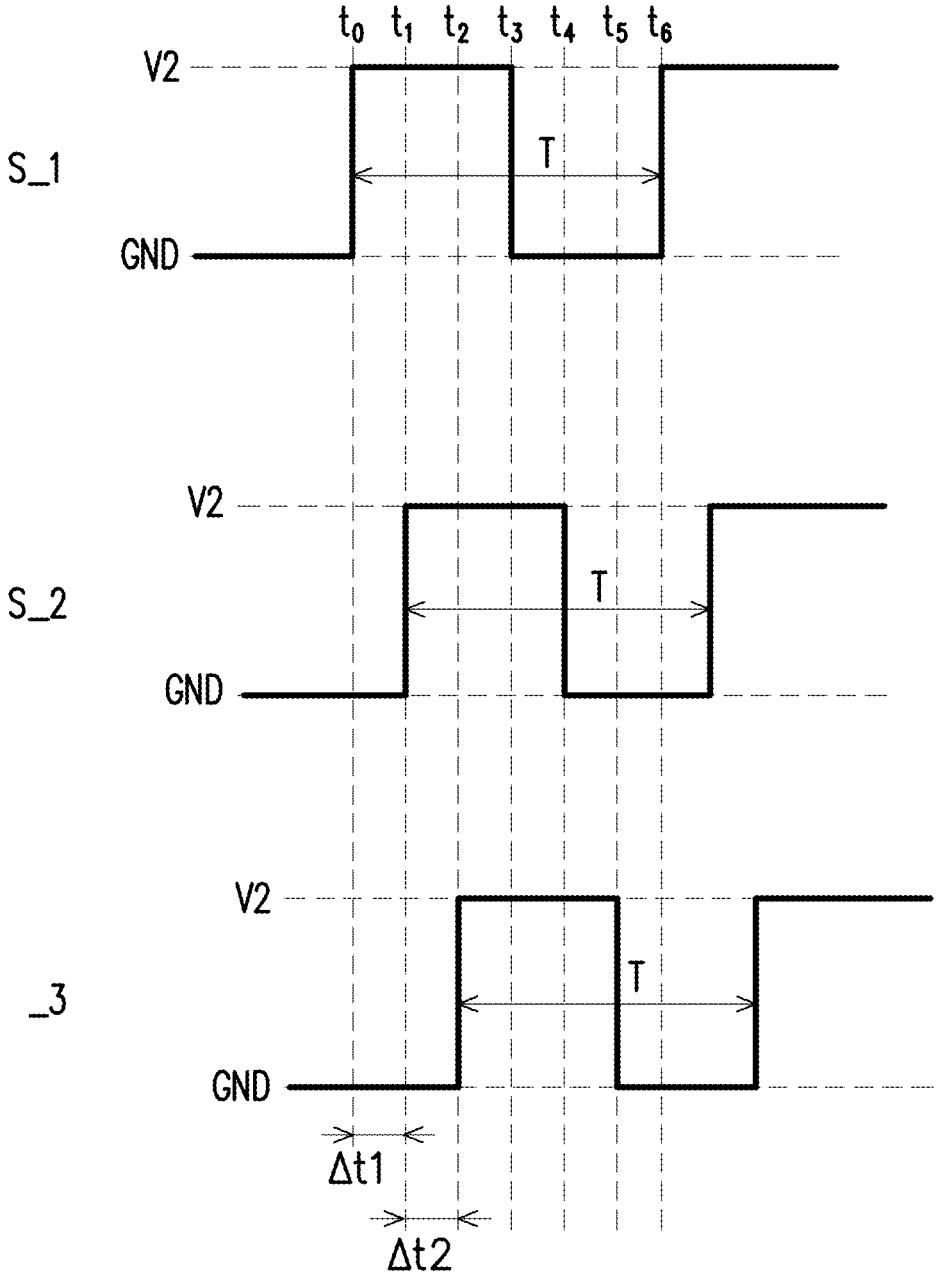
FIG. 4 is a schematic diagram of waveform relationships among multiple control signals of an over drive circuit according to an embodiment of the disclosure.

FIG. 4 is a schematic diagram of waveform relationships among multiple control signals of an over drive circuit according to an embodiment of the disclosure. As shown in FIG. 2, the control signals S_1, S_2, and S_3 are respectively input to the gates of the corresponding NMOS transistors N2_1, N2_2, and N2_3. As shown in FIG. 3A, a waveform structure of each of the control signals S_1, S_2, and S_3 is basically the same, for example, the same in the cycle and the work ratio. However, the time when control signals S_1, S_2, and S_3 are input to the gates of the NMOS transistors N2_1, N2_2, and N2_3 is different.

As shown in FIG. 4, there is a delayed time Δt1 between the control signal S_1 applied to the gate of the NMOS transistor N2_1 and the control signal S_2 applied to the gate of the NMOS transistor N2_2, and there is a delayed time Δt2 between the control signal S_2 applied to the gate of the NMOS transistor N2_2 and the control signal S_3 applied to the gate of the NMOS transistor N2_3. In other words, there is a delayed time between every two of the control signals. As a result, the NMOS transistors N2_1, N2_2, and N2_3 are turned on in sequence. In addition, there are delayed times Δt1 and Δt2 between every two of the control signals S_1, S_2 and S_3, which may be the same or different.

Under this architecture, as the level of each of the control signals S_1, S_2, and S_3 change and there are delayed times Δt1 and Δt2 between each other, the NMOS transistors N2_1, N2_2, and N2_3 that are turned on in sequence exist in on/off style as shown in Table 1 below.

TABLE I

| Transistor | t0~t1 | t1~t2 | t2~t3 | t3~t4 | t4~t5 | t5~t6 |
|---|---|---|---|---|---|---|
| N2_1 | ON | ON | ON | OFF | OFF | OFF |
| N2_2 | OFF | ON | ON | ON | OFF | OFF |
| N2_3 | OFF | OFF | ON | OM | ON | OFF |

As mentioned above, according to an embodiment of the disclosure, the last one of the NMOS transistors originally connected in series is replaced with multiple smaller size NMOS transistors N2_1, N2_2, N2_3 connected in parallel. Through this structure, because the NMOS transistor N2_1, N2_2, and N2_3 are smaller in size and are turned on in sequence, the NMOS transistor N1 may not have excessive stress. Therefore, when the over drive circuit 100 is operating, the source-drain voltage Vds of the turned-on transistor N1 may be reduced. In this way, the integrity of the output signal of the output end OUT may be maintained.

Figure 5:
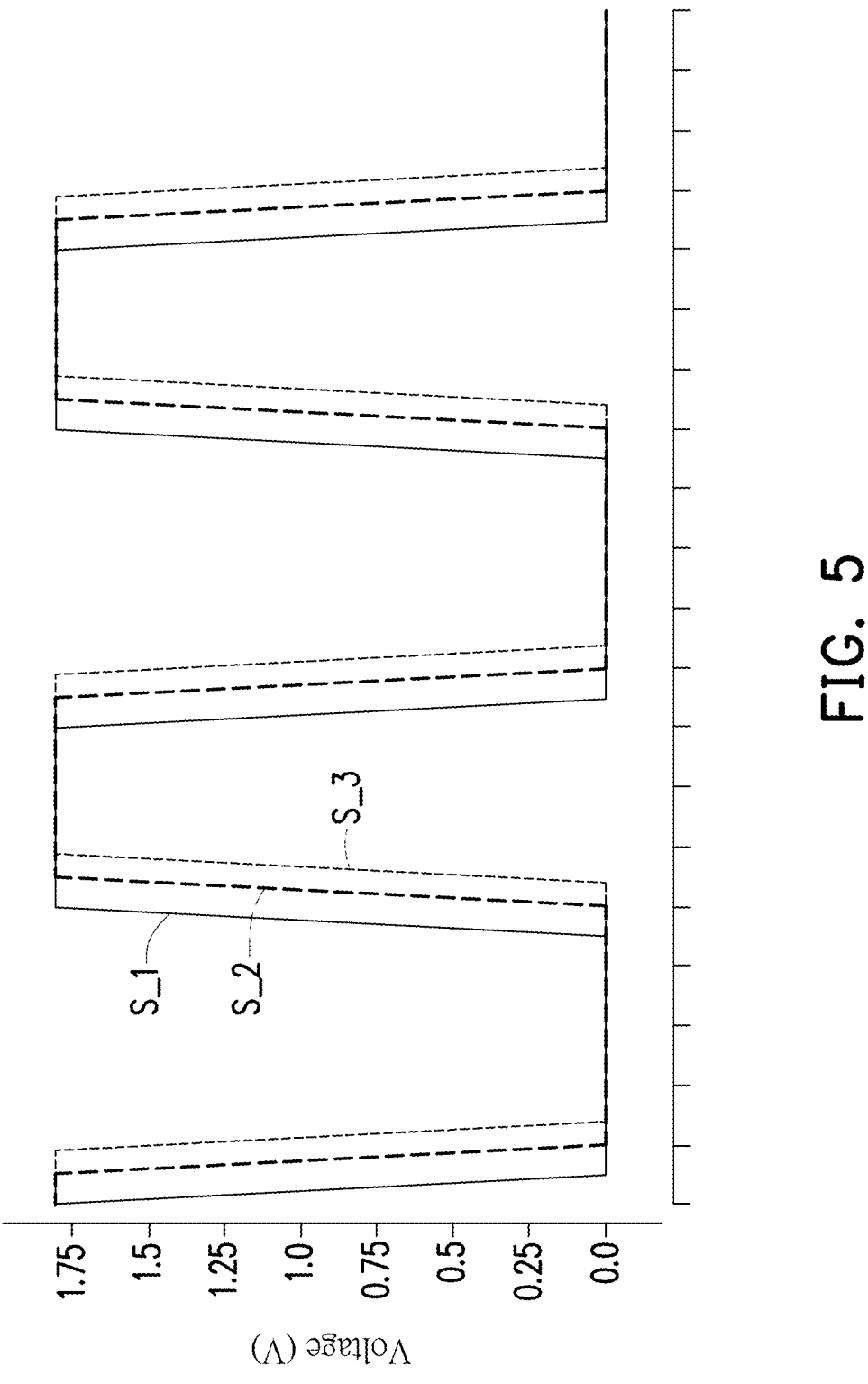
FIG. 5 is a timing chart of multiple control signals according to an embodiment of the disclosure.
Figure 6:
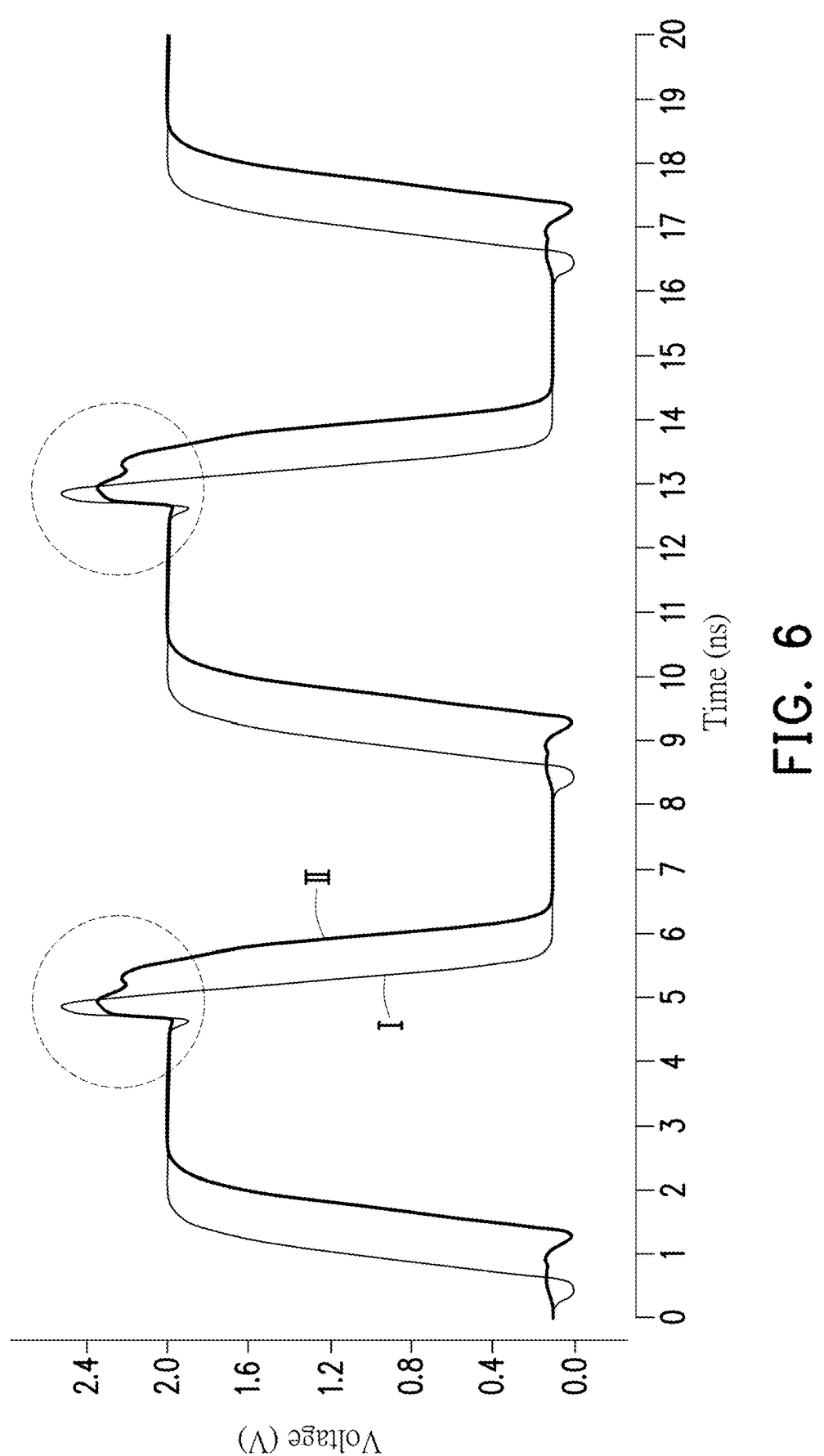
FIG. 6 is a schematic waveform diagram of a source-drain voltage Vds according to a conventional method and an embodiment of the disclosure.
Figure 7:
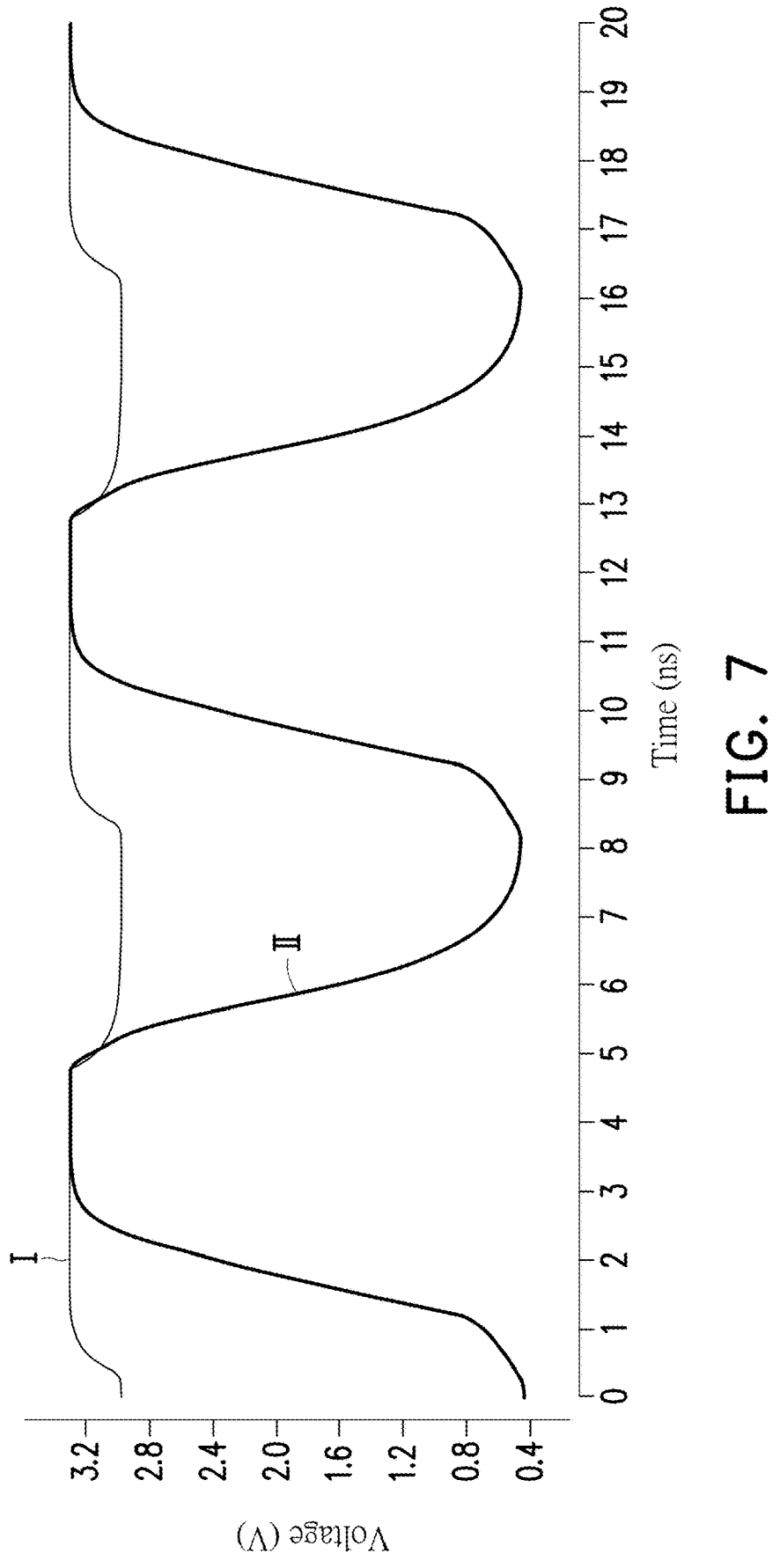
FIG. 7 is a schematic waveform diagram of an output signal according to a conventional method and an embodiment of the disclosure.

The following simulation experiment results are used to illustrate the effects of the embodiments of the disclosure. FIG. 5 is a timing chart of multiple control signals according to an embodiment of the disclosure. FIG. 6 is a schematic waveform diagram of a source-drain voltage Vds according to a conventional method and an embodiment of the disclosure. FIG. 7 is a schematic waveform diagram of an output signal according to a conventional method and an embodiment of the disclosure.

In addition, in this experiment, the second voltage V2 (that is, VDD), as the nominal voltage, is set as 1.8V, the first voltage, as the required voltage, is set as 3.3V, and the capacitive load CL is 5 pF. This simulation experiment is based on a 0.25-year aging test.

FIG. 5 exemplifies the control signals S_1, S_2, and S_3 applied to the gates of the NMOS transistors N2_1, N2_2, and N2_3 in this embodiment. The control signals S_1, S_2, and S_3 have a delayed time between each other, thereby making the NMOS transistors N2_1, N2_2, and N2_3 be turned on in sequence.

Figure 1:
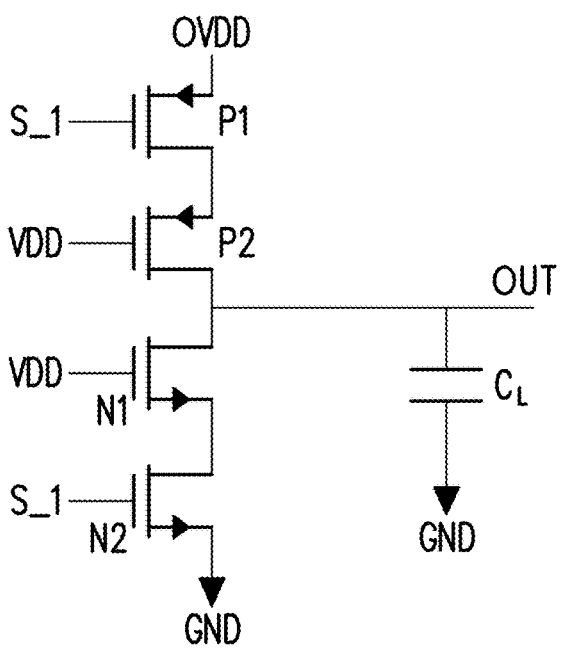
FIG. 1 is a schematic diagram of a conventional over drive circuit.

In addition, from FIG. 6, a curve I represents the conventional method (as shown in FIG. 1), and a curve II represents the embodiment of the disclosure. It can be seen from the waveform diagram of the source-drain voltage Vds of the transistor N1 shown in FIG. 6 that the part affected by stress at a falling edge of the waveform may be reduced through the structure of the embodiment of the disclosure.

In addition, from FIG. 7, based on the conventional method (a waveform I), after the output signal has passed the 0.25-year aging test, the low level of the output signal fails (may not reduce to near OV), and the integrity of the output signal is destroyed. On the contrary, based on an embodiment of the disclosure (a waveform II), after the output signal has passed the 0.25-year aging test, the low level of the output signal is still maintained near OV, and the integrity of the output signal is not destroyed.

In summary, based on the embodiments of the disclosure, the last one of the NMOS transistors connected in series of the original over drive circuit is replaced by the smaller size NMOS transistors connected in parallel. Moreover, the NMOS transistors connected in parallel are turned on in sequence. Accordingly, the stress on the source-drain voltage of the transistor of the over drive circuit may be reduced, and the integrity of the output signal of the over drive circuit may also be maintained.

What is claimed is:

1. An over drive circuit, comprising:
a plurality of P-type transistors, connected to each other in series, wherein each of the plurality of P-type transistors has a control end, a first end, and a second end, and a first end of a first P-type transistor of the plurality of P-type transistors is coupled to a first voltage; and
a first N-type transistor connected to the plurality of P-type transistors in series, wherein the first N-type transistor has a control end, a first end, and a second end, a first end of the first N-type transistor is coupled to a second end of a last P-type transistor of the plurality of P-type transistors;
an output end disposed between the plurality P-type transistors and the first N-type transistor; and
a load, coupled between the output end and the ground potential; and
a plurality of transistors connected in parallel and connected to the second end of the first N-type transistor,
wherein a control end of each of the plurality of transistors is respectively coupled to each of a plurality of corresponding control signals,
one of the plurality of control signals is further input to a control end of the first P-type transistor of the plurality of P-type transistors,
the control ends of the plurality of P-type transistors other than the first P-type transistor and the first N-type transistor receive a second voltage, wherein the first voltage is greater than the second voltage, and
the plurality of control signals makes the plurality of transistors be turned on in sequence.

2. The over drive circuit according to claim 1, wherein a level value of each of the plurality of control signals is between the second voltage and the ground potential.

3. The over drive circuit according to claim 1, wherein there is a delayed time between every two of the plurality of control signals.

4. The over drive circuit according to claim 3, wherein the delayed time between every two of the plurality of control signals is the same or different.

5. The over drive circuit according to claim 1, wherein a sum of a channel length of each of the plurality of transistors is equal to a channel length of the first N-type transistor.

6. The over drive circuit according to claim 1, wherein a channel length of each of the plurality of transistors is the same.

7. The over drive circuit according to claim 1, wherein the load is a capacitive load.

8. The over drive circuit according to claim 1, wherein the plurality of P-type transistors are P metal oxide semiconductor transistors, and the first N-type transistor and the plurality of transistors are NMOS transistors.

9. An input/output circuit, comprising:

an over drive circuit, wherein the over drive circuit comprises:

a plurality of P-type transistors, connected to each other in series, wherein each of the plurality of P-type transistors has a control end, a first end, and a second end, and a first end of a first P-type transistor of the plurality of P-type transistors is coupled to a first voltage; and a first N-type transistor connected to the plurality of P-type transistors in series, wherein the first N-type transistor has a control end, a first end, and a second end, a first end of the first N-type transistor is coupled to a second end of a last P-type transistor of the plurality of P-type transistors;

an output end disposed between the plurality P-type transistors and the first N-type transistor; and a load, coupled between the output end and the ground potential, a plurality of transistors connected in parallel and connected to the second end of the first N-type transistor, a control end of each of the plurality of transistors is respectively coupled to each of a plurality of corresponding control signals, one of the plurality of control signals is further input to a control end of the first P-type transistor of the plurality of P-type transistors, the control ends of the plurality of P-type transistors other than the first P-type transistor and the first N-type transistor receive a second voltage, wherein the first voltage is greater than the second voltage, and the plurality of control signals makes the plurality of transistors be turned on in sequence.

10. The input/output circuit according to claim 9, wherein a level value of each of the plurality of control signals is between the second voltage and the ground potential.

11. The input/output circuit according to claim 9, wherein there is a delayed time between every two of the plurality of control signals.

12. The input/output circuit according to claim 11, wherein the delayed time between every two of the plurality of control signals is the same or different.

13. The input/output circuit according to claim 9, wherein a sum of a channel length of each of the plurality of transistors is equal to a channel length of the first N-type transistor.

14. The input/output circuit according to claim 9, wherein a channel length of each of the plurality of transistors is the same.

15. The input/output circuit according to claim 9, wherein the load is a capacitive load.

16. The input/output circuit according to claim 9, wherein the plurality of P-type transistors is PMOS transistors, and the first N-type transistor and the plurality of transistors are NMOS transistors.

* * * * *